(12) United States Patent
Son

(10) Patent No.: US 9,040,416 B2
(45) Date of Patent: May 26, 2015

(54) MANUFACTURING METHOD OF METAL WIRE AND THIN TRANSISTOR ARRAY PANEL

(71) Applicant: Samsung Display Co., Ltd., Yongin (KR)

(72) Inventor: Dong-Jin Son, Yongin (KR)

(73) Assignee: Samsung Display Co., Ltd., Yongin (KR)

( * ) Notice: Subject to any disclaimer, the term of this patent is extended or adjusted under 35 U.S.C. 154(b) by 0 days.

(21) Appl. No.: 14/019,008

(22) Filed: Sep. 5, 2013

(65) Prior Publication Data

US 2014/0335691 A1    Nov. 13, 2014

(30) Foreign Application Priority Data

May 10, 2013    (KR) .................... 10-2013-0053237

(51) Int. Cl.
 *H01L 21/44* (2006.01)
 *H01L 27/32* (2006.01)
 *H01L 27/12* (2006.01)

(52) U.S. Cl.
 CPC .......... *H01L 27/3244* (2013.01); *H01L 27/124* (2013.01)

(58) Field of Classification Search
 USPC .................................. 438/652, 656
 See application file for complete search history.

(56) References Cited

U.S. PATENT DOCUMENTS

| | | | | |
|---|---|---|---|---|
| 4,920,071 A | * | 4/1990 | Thomas ................ | 438/626 |
| 5,272,101 A | * | 12/1993 | Forouhi et al. ........ | 438/600 |
| 5,498,573 A | * | 3/1996 | Whetten ................ | 438/644 |
| 6,809,021 B2 | * | 10/2004 | Ohtani et al. ........ | 438/622 |
| 8,293,595 B2 | | 10/2012 | Yamazaki et al. | |
| 2002/0028574 A1 | * | 3/2002 | Murata et al. ........ | 438/618 |
| 2007/0012926 A1 | | 1/2007 | Hong et al. | |
| 2007/0114922 A1 | | 5/2007 | Sung et al. | |
| 2008/0062112 A1 | | 3/2008 | Umezaki | |
| 2009/0278131 A1 | * | 11/2009 | Kwon et al. .......... | 257/72 |
| 2010/0123152 A1 | | 5/2010 | Sugisawa et al. | |
| 2012/0146032 A1 | * | 6/2012 | Lee et al. ............ | 257/59 |

FOREIGN PATENT DOCUMENTS

| | | |
|---|---|---|
| KR | 10-2004-0033395 | 4/2004 |
| KR | 10-2005-0099346 | 10/2005 |
| KR | 10-2009-0072432 | 7/2009 |

OTHER PUBLICATIONS

Non-Final Office Action dated Nov. 19, 2014, in U.S. Appl. No. 14/222,275.

Notice of Allowance dated Mar. 5, 2015, in U.S. Appl. No. 14/222,275.

* cited by examiner

*Primary Examiner* — Karen Kusumakar

(74) *Attorney, Agent, or Firm* — H.C. Park & Associates, PLC

(57) ABSTRACT

A manufacturing method of a wire including: forming a lower layer on a substrate; forming a middle layer on the lower layer; forming an upper layer on the middle layer; forming, exposing, and developing a photoresist layer on the upper layer to form a photoresist pattern; and etching the upper layer, the middle layer, and the lower layer by using the photoresist pattern as a mask to form a wire such that the upper layer covers an end of the middle layer.

4 Claims, 14 Drawing Sheets

MANUFACTURING METHOD OF METAL WIRE AND THIN TRANSISTOR ARRAY PANEL

CROSS-REFERENCE TO RELATED APPLICATION

This application claims priority from and the benefit of Korean Patent Application No. 10-2013-0053237, filed on May 10, 2013, which is hereby incorporated by reference for all purposes as if fully set forth herein.

BACKGROUND

1. Field

Exemplary embodiments of the present invention relate to a method of forming metal wire and a thin film transistor array panel.

2. Discussion of the Background

Recently, the display device market has changed through the introduction of flat panel displays (FPDs) that easily realize a large area and have reduced weight and thickness. Among the many kinds of flat panel displays, an organic light emitting diode display (OLED) is most advantageous in reducing the thickness and weight because it is a self-luminescent type requiring no light source.

A pixel in a display device includes a plurality of thin film transistors, and the thin film transistor includes a gate electrode connected to a gate line transmitting a scan signal, a source electrode connected to a data line transmitting a signal to be applied to a pixel electrode, a drain electrode facing the source electrode, and a semiconductor electrically connected to the source electrode and the drain electrode.

In order to form a metal wire such as the data line and the gate line, a metal layer is formed on the substrate and is patterned through a photolithography process using a photoresist pattern.

The photoresist pattern is formed through an exposing and developing process. The metal layer is etched by a developing solution used in the developing process and an impurity is generated according to the metal used.

In particular, a metal layer made of aluminum for producing a low resistance wire reacts with the developing solution, the impurity is generated, and the generated impurity remains on the metal layer. As a result, the impurity remaining on the metal layer may be recognized as noise in a testing process.

The above information disclosed in this Background section is only for enhancement of understanding of the background of the invention and, therefore, it may contain information that does not form the prior art that is already known in this country to a person of ordinary skill in the art.

SUMMARY

Exemplary embodiments of the present invention relate to a wire forming method for preventing the generation of an impurity by a developing solution when developing a photoresist, and a manufacturing method of a wire and a thin film transistor array panel using the same.

Additional features of the invention will be set forth in the description which follows, and in part will be apparent from the description, or may be learned by practice of the invention.

An exemplary embodiment of the present invention discloses a method of manufacturing a wire including: forming a lower layer on a substrate; forming a middle layer on the lower layer; forming an upper layer on the middle layer; forming a photoresist pattern by exposing and developing a photoresist layer formed on the upper layer; and forming a wire by etching the upper layer, the middle layer, and the lower layer by using the photoresist pattern as a mask, wherein the upper layer covers an end of the middle layer.

An exemplary embodiment of the present invention also discloses a manufacturing method of a thin film transistor array panel including: forming a first lower layer on a substrate; forming a first middle layer on the first lower layer; forming a first upper layer on the first middle layer; forming a photoresist pattern by exposing and developing a photoresist layer formed on the first upper layer; forming a first signal line by etching the first upper layer, the first middle layer, and the first lower layer by using the photoresist pattern as a mask; forming a thin film transistor connected to the first signal line; forming a second signal line connected to the thin film transistor; and forming a first electrode connected to the second signal line, wherein the first upper layer covers an end of the first middle layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
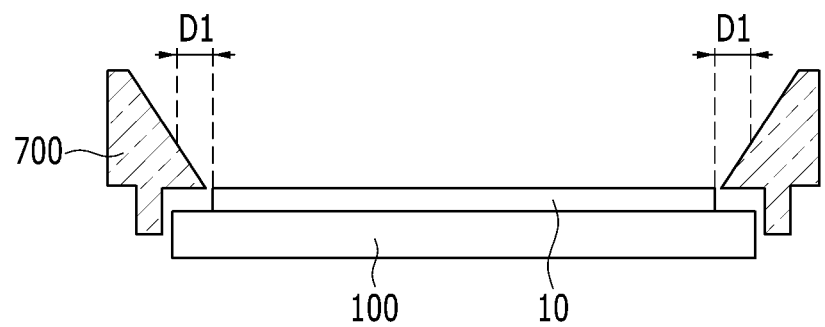
FIG. 1, FIG. 2, FIG. 3, and FIG. 4 are views illustrating a wire forming method according to an exemplary embodiment of the present invention.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention. This invention may, however, be embodied in many different forms and should not be construed as limited to the exemplary embodiments set forth herein. Rather, these exemplary embodiments are provided so that this disclosure is thorough, and will fully convey the scope of the invention to those skilled in the art. In the drawings, the size and relative sizes of layers, regions, and other elements, including widths, lengths, thicknesses and the like, may be exaggerated for clarity. Like reference numerals in the drawings denote like elements It will be understood that when an element, such as a layer, film, region, or substrate, is referred to as being "on" another element, it can be directly on or directly connected to the other element, or intervening elements may also be present. In contrast, when an element is referred to as being "directly on" or "directly connected to" another element, there are no intervening elements present. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

In addition, unless explicitly described to the contrary, the word "comprise" and variations such as "comprises" or "comprising" will be understood to imply the inclusion of stated elements but not the exclusion of any other elements. Further, throughout the specification, "on" implies being positioned above or below a target element and does not imply being necessarily positioned on the top on the basis of a gravity direction.

A wire forming method according to an exemplary embodiment of the present invention will be described below.

Figure 3:
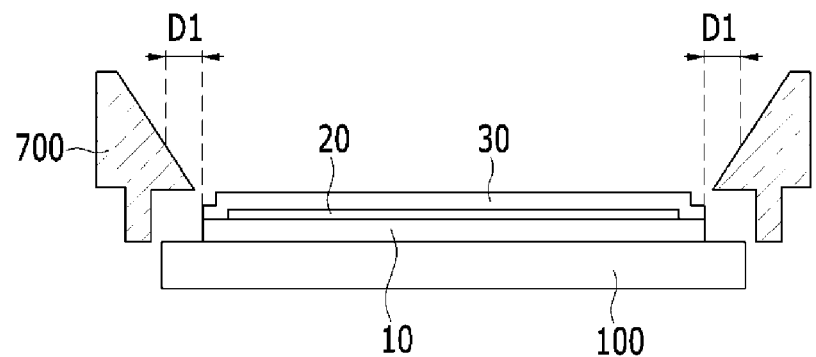
Figure 4:
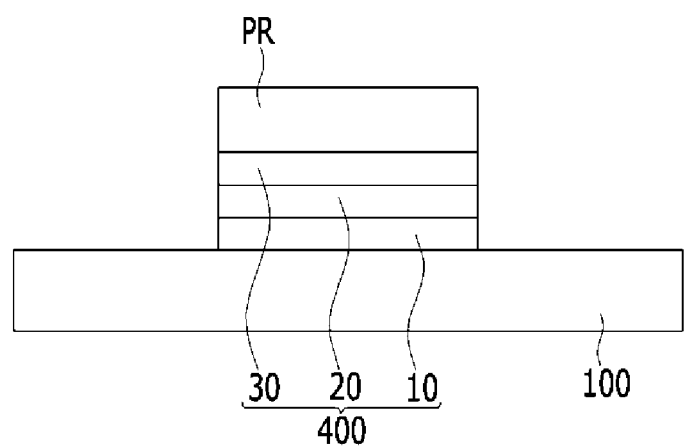
Figure 5:
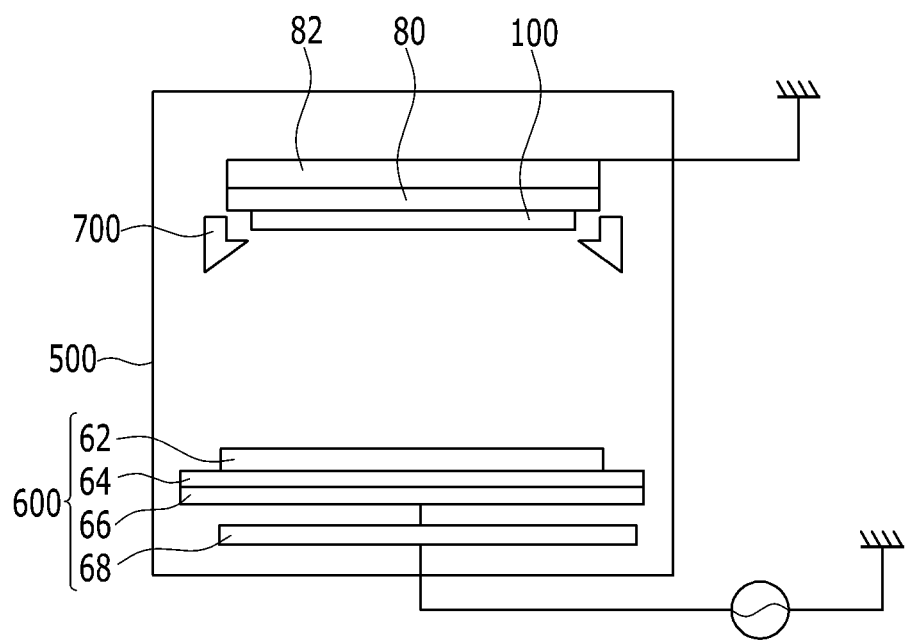
FIG. 5 is a schematic cross-sectional view of a sputtering device according to an exemplary embodiment of the present invention.

FIG. 1 to FIG. 4 are views explaining a wire forming method according to an exemplary embodiment of the present invention, and FIG. 5 is a schematic cross-sectional view of a sputtering device according to an exemplary embodiment of the present invention.

As shown in FIG. 1, a first metal layer 10 is formed on a substrate 100. The first metal layer 10 may be formed by using a sputtering device shown in FIG. 5.

Referring to FIG. 5, a sputtering device 1001 according to an exemplary embodiment of the present invention includes a chamber 500, and a target part 600 and a mask 700 provided in the chamber 500.

The chamber 500 maintains a vacuum during the sputtering process, and high frequency power is applied from a power source outside the chamber 500.

The target part 600 includes a target 62, a lower supporter 64, a cathode plate 66, and a magnet 68.

The lower supporter 64 is fixed to the target 62 which is a supply source of a deposition material formed on the substrate 100 by sputtering.

The target 62, which is a metallic material to be formed on a substrate, is bombarded with positive ions in the chamber. The positive ions are generated by acceleration of electrons such that a material on the surface of the target 62 is separated from the target 62, thereby, forming the first metal layer 10 on the substrate 100.

The cathode plate 66 is connected to the high frequency power source to apply a high frequency voltage to the target 62, thereby generating plasma between the substrate 100 and the target 62.

The magnet 68 applies a magnetic field to prevent the electrons generated in the plasma from reaching into other portions of the sputtering device.

The mask 700 prevents the thin film from being formed at the edge of the substrate 100. The mask 700 is a shadow mask covering the substrate 100 and covers the edge of the substrate 100.

An upper supporter 80 receives the substrate 100 and may be a carrier to support and carry the substrate 100 in the chamber 500.

A grounded anode plate 82 is formed under the upper supporter 80.

Referring to FIG. 1, the substrate 100 and the mask 700 overlap by a first width D1.

Figure 2:
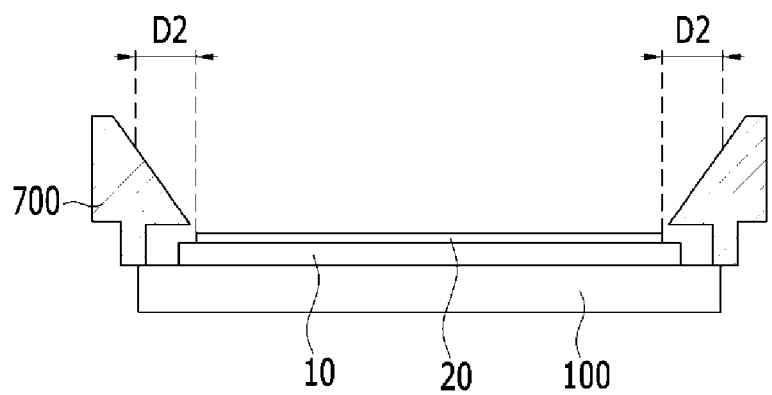

As shown in FIG. 2, a second metal layer 20 is formed on the first metal layer 10. A boundary line of the second metal layer 20 is positioned within a boundary line of the first metal layer 10.

The second metal layer 20 may also be formed by using the sputtering device of FIG. 5. At this time, the first metal layer 10 and the second metal layer 20 may be respectively formed by the sputtering devices to which different targets are mounted according to a material to be formed.

The mask 700 overlaps the substrate 100 and the first metal layer 10 by a second width D2. Accordingly, the boundary of the second metal layer 20 is positioned within the boundary of the first metal layer 10. The second width D2 may range from about 3 mm to 6 mm.

As shown in FIG. 3, a third metal layer 30 is formed on the second metal layer 20. The third metal layer 30 is formed to cover an end (or the boundary) of the second metal layer 20 such that the edge of the third metal layer 30 contacts the edge of the first metal layer 10.

The third metal layer 30 may also be formed by using the sputtering device of FIG. 5.

The second metal layer 20 and the third metal layer 30 may be formed by the sputtering device to which different targets are mounted according to the material to be formed.

The mask 700 overlaps the substrate 100 by a third width D3, and the boundary of the second metal layer 20 is covered by the third metal layer 30. The third width D3 may be the same as the first width D1 and, when using the same material, the same chamber may be applied.

As shown in FIG. 4, a photoresist layer is formed on the third metal layer 30, and is exposed and developed to form a photoresist pattern PR.

In the developing process of the photoresist layer, the second metal layer 20 may be damaged by the developing solution, thereby being undercut, or the separated second metal layer 20 may be attached to the surface of the third metal layer 30 as an impurity.

However, in an exemplary embodiment, the third metal layer 30 completely covers the end of the second metal layer 20 such that the end of the second metal layer 20 is not exposed to the developing solution, thereby preventing the impurity resulting from the second metal layer 20.

Next, the third metal layer 30, the second metal layer 20, and the first metal layer 10 are etched by using the photoresist pattern as the mask to form a wire 400 made of a triple-layered structure.

Next, an organic light emitting diode (OLED) display including the wire shown in FIG. 1 to FIG. 4, and a manufacturing method thereof will be described with reference to accompanying drawings.

Figure 6:
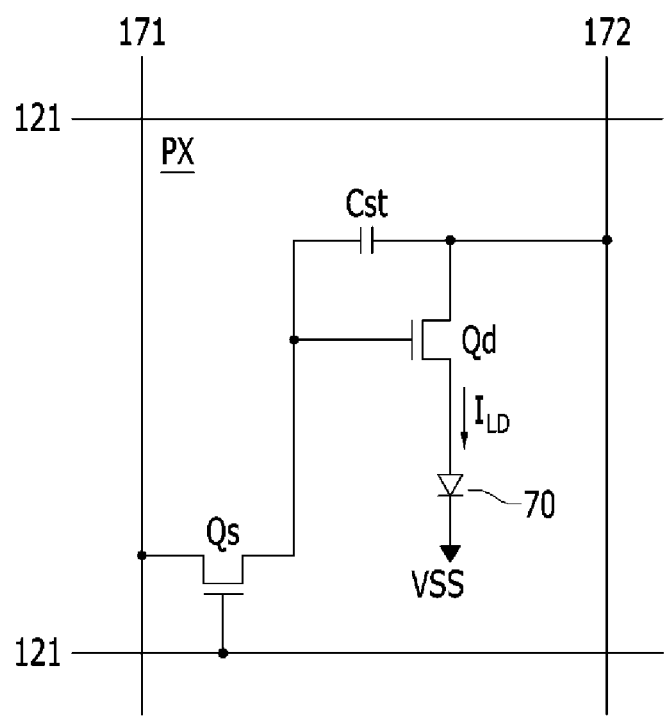
FIG. 6 is a schematic circuit diagram of a pixel circuit included in an organic light emitting diode (OLED) display according to an exemplary embodiment of the present invention.

FIG. 6 is a circuit diagram of a pixel circuit of an organic light emitting diode (OLED) display according to an exemplary embodiment of the present invention.

The organic light emitting diode (OLED) display according to the present exemplary embodiment includes a plurality of signal lines 121, 171, and 172, and a pixel PX connected thereto.

The signal lines include a scan signal line 121 transmitting a gate signal (or a scan signal), a data line 171 transmitting a data signal, and a driving voltage line 172 transmitting a driving voltage.

The gate lines 121 extend substantially in a row direction and substantially parallel to each other, and the data lines 171 extend substantially in a column direction and are substantially parallel to each other. The driving voltage lines 172 extend substantially in a column direction and substantially parallel to each other, although they may instead extend in the row direction or the column direction, and may form a mesh shape.

One pixel PX includes a switching transistor Qs, a driving transistor Qd, a storage capacitor Cst, and an organic light emitting diode 70.

The switching transistor Qs has a control terminal, an input terminal, and an output terminal. The control terminal is connected to the scan signal line 121, the input terminal is connected to the data line 171, and the output terminal is connected to the driving transistor Qd. The switching transistor Qs responds to the scan signal received from the scan signal line 121 to transfer the data signal received from the data line 171 to the driving transistor Qd.

The driving transistor Qd has a control terminal, an input terminal, and an output terminal. The control terminal is connected to the switching transistor Qs, the input terminal is connected to the driving voltage line 172, and the output terminal is connected to the organic light emitting diode 70. The driving transistor Qd allows the output current $I_{LD}$ having an amplitude that varies according to the voltage applied between the control terminal and the output terminal to flow therethrough.

The capacitor Cst is connected between the control terminal and the input terminal of the driving transistor Qd. This capacitor Cst charges the data signal applied to the control terminal of the driving transistor Qd and maintains the data signal even after the switching transistor Qs is turned off.

The organic light emitting diode 70 (OLED) has an anode connected to the output terminal of the driving transistor Qd and a cathode connected to a common voltage Vss. The organic light emitting diode 70 displays an image by emitting light, and the intensity thereof is changed according to the output current ILD of the driving transistor Qd. The organic light emitting diode 70 may include an organic material intrinsically emitting light of at least one of primary colors, such as red, green, and blue. The organic light emitting diode display displays a desired image by a spatial sum of the colors.

A manufacturing method of the organic light emitting diode (OLED) display according to an exemplary embodiment having the above pixel will be described.

Figure 11:
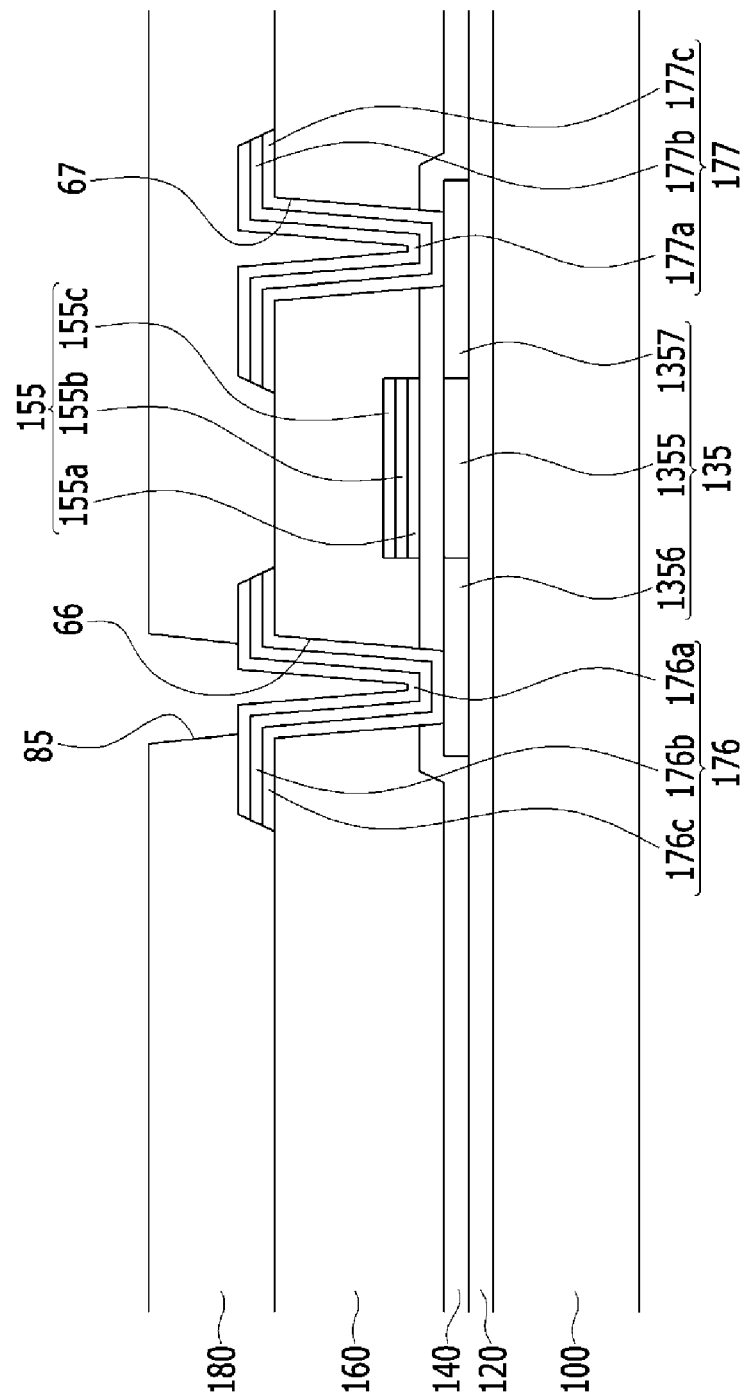
Figure 12:
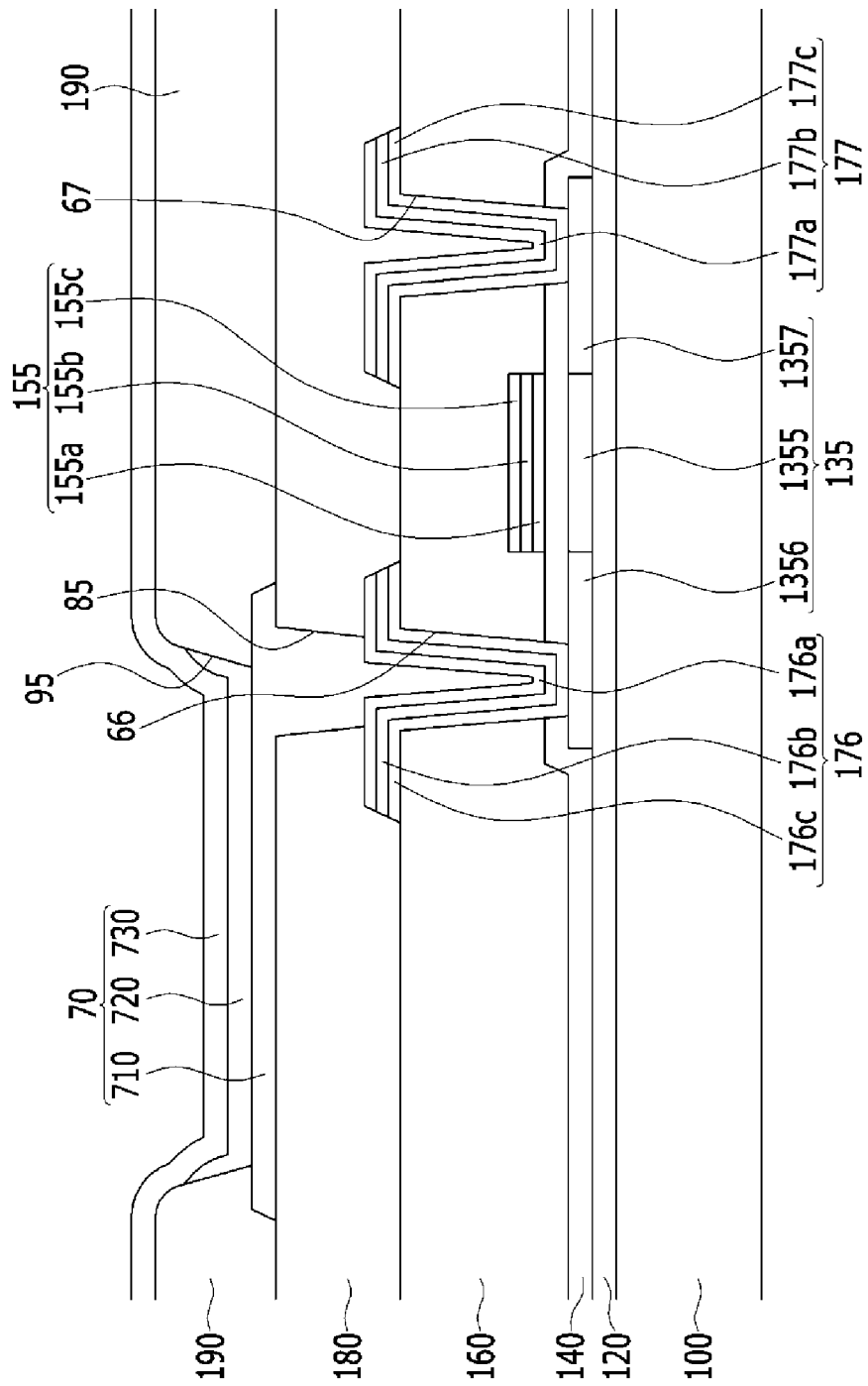
Figure 13:
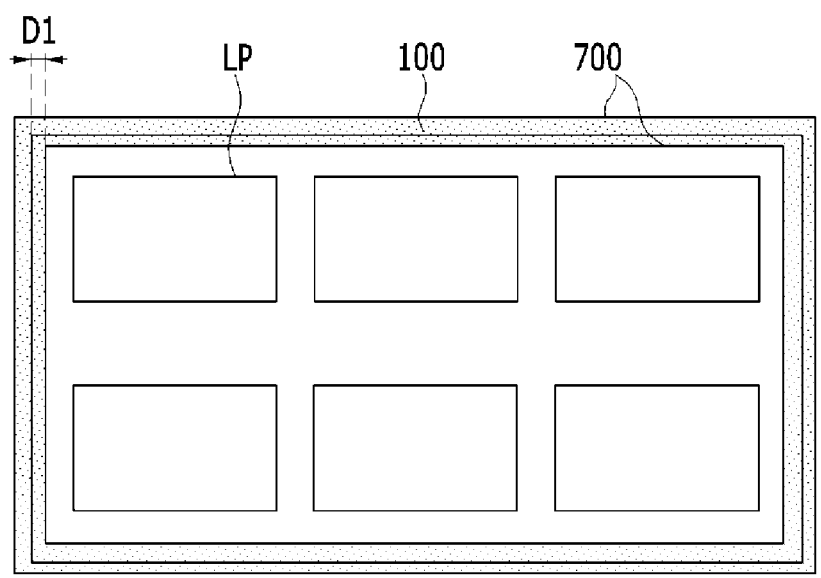
FIG. 13 and FIG. 14 are top plan views of a mother substrate and a mask according to an exemplary embodiment of the present invention.
Figure 14:
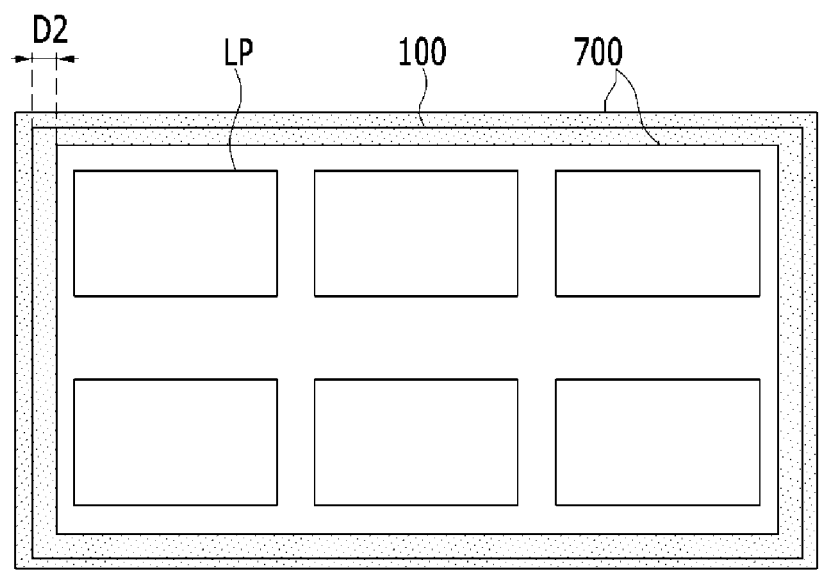

FIG. 7 to FIG. 12 are cross-sectional views to explain a manufacturing method of the organic light emitting diode (OLED) display of FIG. 5, and FIG. 13 and FIG. 14 are top plan views of a mother substrate and a mask according to an exemplary embodiment.

In FIG. 7 to FIG. 12, the manufacturing method will be described directed to the driving thin film transistor Qd and the organic light emitting element 70 of FIG. 6. Hereafter, the driving thin film transistor Qd is referred to as a thin film transistor.

Figure 7:
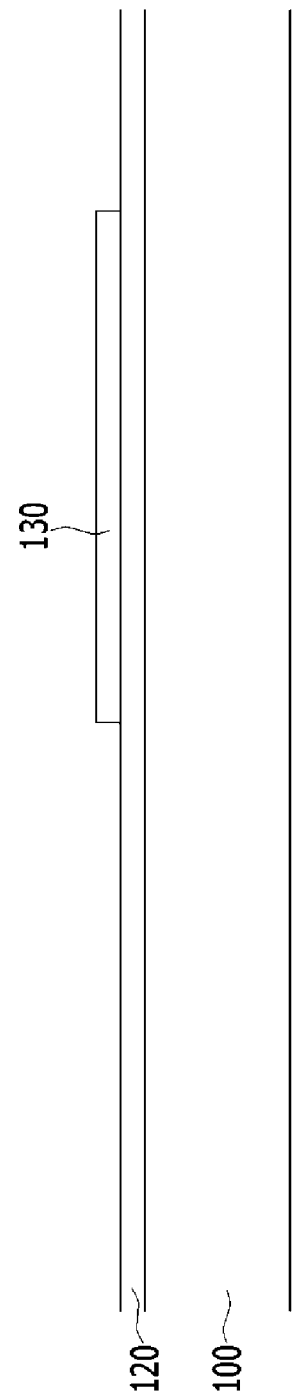
FIG. 7, FIG. 8, FIG. 9, FIG. 10, FIG. 11, and FIG. 12 are cross-sectional views illustrating a manufacturing method of the organic light emitting diode (OLED) display of FIG. 5.

As shown in FIG. 7, a buffer layer 120 is formed on a substrate 100.

The substrate 100 may be a transparent insulating substrate formed of glass, quartz, ceramic, plastic, or the like, or the substrate 100 may be a metallic substrate formed of stainless steel or the like.

In an exemplary embodiment, only one thin film transistor is described. However, as shown in FIG. 13, the substrate 100 may be a mother substrate in which a plurality of organic light emitting display panels LP are simultaneously formed.

The buffer layer 120 may be formed as a single layer of silicon nitride ($SiN_x$) or as a dual layer structure in which silicon nitride ($SiN_x$) and silicon oxide ($SiO_2$) are stacked.

The buffer layer 120 serves to prevent unnecessary ingredients, such as impurities or water, from penetrating, and also serves to planarize a surface.

Furthermore, a semiconductor 130 is formed by forming an amorphous silicon layer on the buffer layer 120, and then crystallizing and patterning the amorphous silicon layer.

Figure 8:
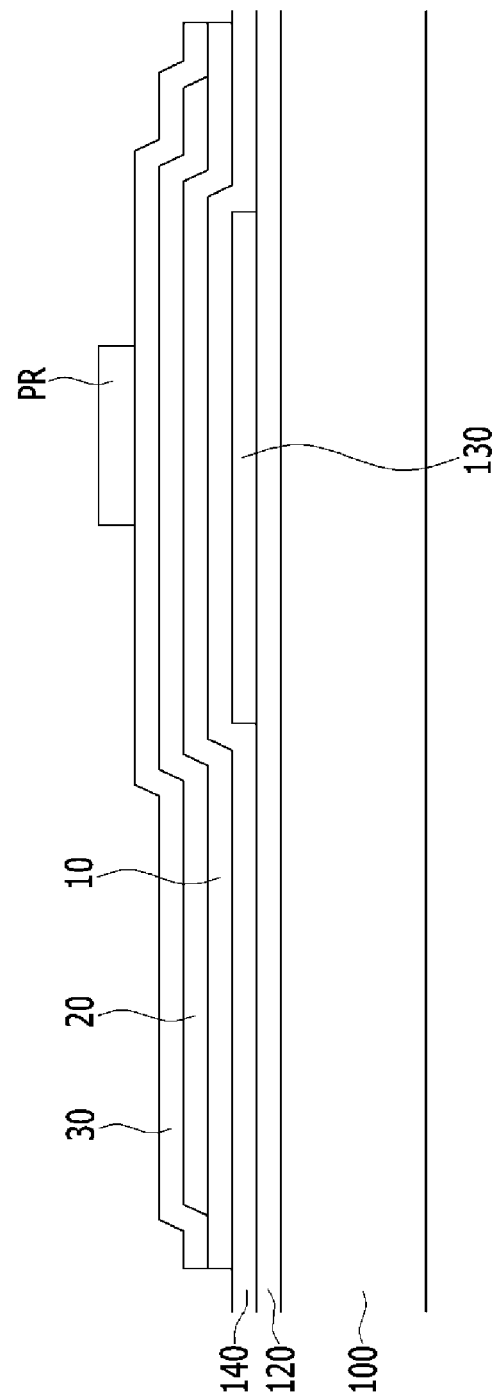

As shown in FIG. 8, a gate insulating layer 140 made of silicon nitride or silicon oxide is formed on the semiconductor pattern 130, and the first metal layer 10, the second metal layer 20, and the third metal layer 30 are deposited on the gate insulating layer 140. A photoresist pattern PR is then formed on the third metal layer 30. The first metal layer 10 is formed of Mo, the second metal layer 20 is formed of AlNiLa, and the third metal layer 30 is formed of Mo.

In an exemplary embodiment, a sequence of Mo/AlNiLa/Mo is deposited, however Ti, W, and Al may also be included.

The first to third metal layers 10, 20, and 30 may be formed by the method of FIG. 1 to FIG. 4, and the third metal layer 30 may be formed to completely cover the end of the second metal layer 20 by changing the degree of overlapping of the mask 700 of the sputtering device of FIG. 5 with the substrate 100.

As shown in FIG. 13, the mask 700 and the substrate 100 overlap each other for the first metal layer 10 and the third metal layer 30 to have a first width D1 for the substrate 100, and as shown in FIG. 14, the mask 700 and the substrate 100 overlap each other for the second metal layer 20 to have a second width D2 for the substrate 100. The second width D2 is greater than the first width D1. Accordingly, the third metal layer 30 is formed to completely cover the end of the second metal layer 20.

In an exemplary embodiment, if the third metal layer 30 is formed to cover the second metal layer 20, the second metal layer 20 may not be damaged by the photoresist layer developing solution, and is protected.

In the above exemplary embodiment, although the thin films are deposited with the sequence of Mo/AlNiLa/Mo, the present invention is not limited thereto, and all may be applied when forming the wire including the metal that is etched by the developing solution. That is, the end of the metal layer that is etched by the developing solution is covered by the metal layer that is not etched by the developing solution so as to not be exposed to the developing solution.

Figure 9:
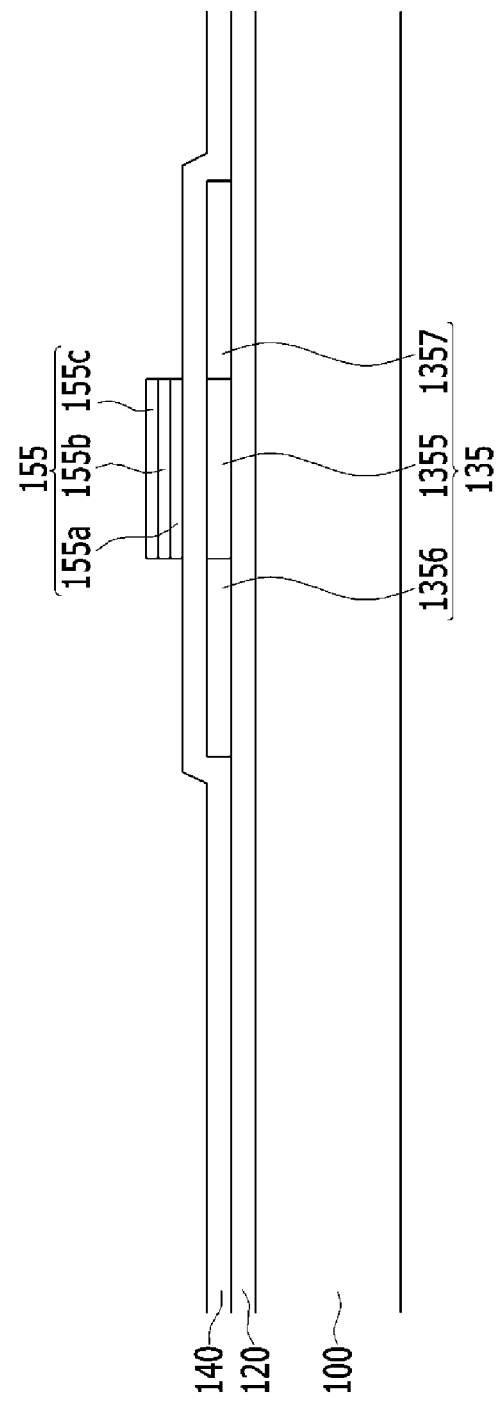

As shown in FIG. 9, by using the photoresist pattern PR as a mask, the third metal layer 30, the second metal layer 20, and the first metal layer 10 are etched to form a gate electrode 155 including a triple layer of an upper layer 155c, a middle layer 155b, and a lower layer 155a.

By using the gate electrode 155 as a mask, conductive impurity ions are doped to the semiconductor pattern 130 with high concentration to form a semiconductor 135 having a source region 1356 and a drain region 1357. A channel region 1355 is formed between the source region 1356 and the drain region 1357.

Figure 10:
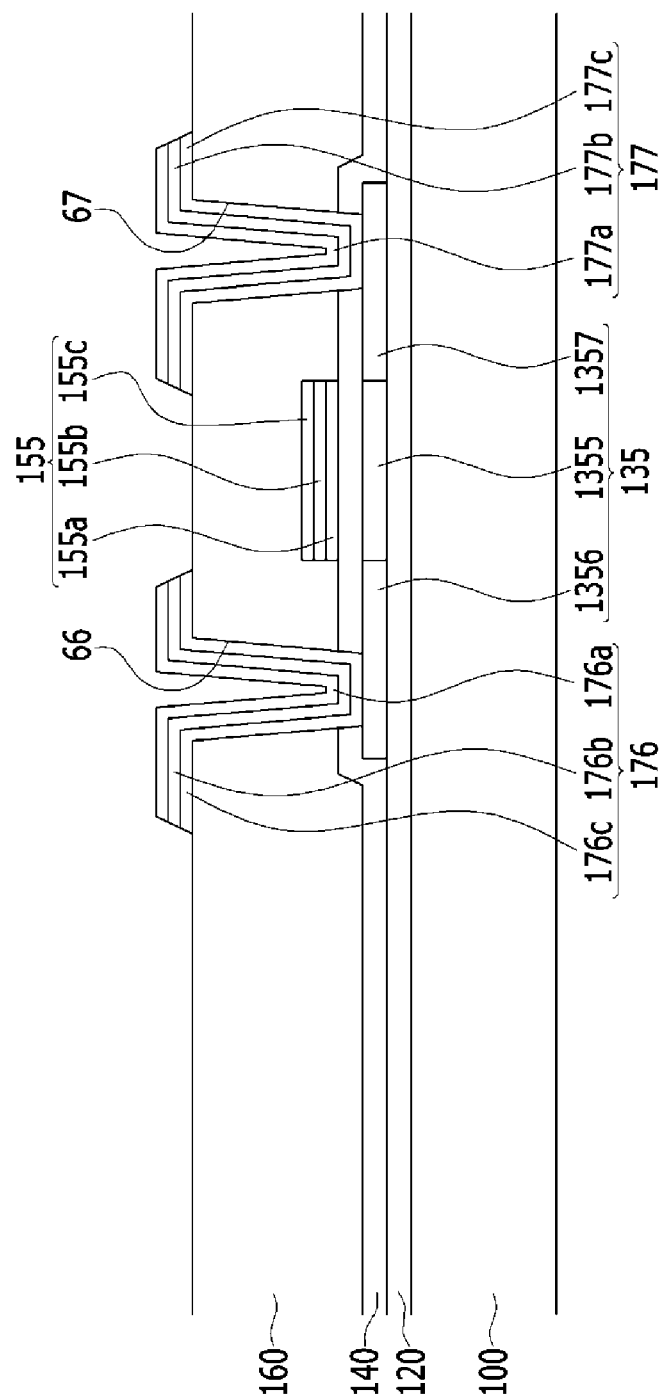

As shown in FIG. 10, a first interlayer insulating layer 160 is formed on the gate electrode 155.

The first interlayer insulating layer 160 and the gate insulating layer 140 are etched to form contact holes 66 and 67 exposing the semiconductor 135.

A fourth metal layer, a fifth metal layer, and a sixth metal layer are formed on the first interlayer insulating layer 160, and a photoresist pattern is formed on the sixth metal layer. The fourth metal layer is made of Mo, the fifth metal layer is made of Al, and the sixth metal layer is made of Mo.

By using the photoresist pattern as the mask, the sixth metal layer, the fifth metal layer, and the fourth metal layer are etched to form a source electrode 176 and a drain electrode 177 connected to the source region 135b and the drain region 135c through the contact holes 66 and 67 and including the triple layer of the upper layer (176c and 177c), the middle layer (176b and 177b), and the lower layer (176a and 177a).

If the sixth metal layer is formed to cover the fifth metal layer, the fifth metal layer made of aluminum is not damaged by the developing solution, and is protected.

As shown in FIG. 11, a second interlayer insulating layer 180 is formed on the source electrode 176 and the drain electrode 177.

The second interlayer insulating layer 180 is etched to form a contact hole 85 exposing the drain electrode 177.

As shown in FIG. 12, a metal layer is formed on the interlayer insulating layer 180 and is patterned to form a first electrode 710.

A pixel definition layer 190 having an opening 95 is formed on the first electrode 710, an organic emission layer 720 is formed in the opening 95 of the pixel definition layer 190, and a second electrode 730 is formed on the organic emission layer 720.

In an exemplary embodiment, when forming the metal layer of the triple layer, the thin film made of aluminum is not exposed to the developing solution used to form the photoresist pattern, thereby preventing damage to the metal layer due to the developing solution and also preventing generation of the impurity.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A method of manufacturing a thin film transistor array panel, comprising:
   forming a first lower layer on a substrate;
   forming a first middle layer on the first lower layer;
   forming a first upper layer on the first middle layer;
   forming a photoresist pattern on the first upper layer using a first developing process;
   forming a first signal line by etching the first upper layer, the first middle layer, and the first lower layer by using the photoresist pattern as a mask;
   forming a thin film transistor connected to the first signal line;
   forming a second signal line connected to the thin film transistor; and
   forming a first electrode connected to the second signal line,
   wherein:
   the first upper layer covers an end of the first middle layer;
   the first lower layer, the first middle layer, and the first upper layer are formed in a sputtering device including a mask aligned with edges of the substrate;
   the mask is aligned to overlap the substrate by a first width when forming the first middle layer;
   the mask is aligned to overlap the substrate by a second width when forming the first upper layer; and
   the first width is less than the second width.

2. The method of claim 1, wherein the forming of the second signal line further comprises:
   forming a second lower layer on the substrate;
   forming a second middle layer on the second lower layer;
   forming a second upper layer on the second middle layer;
   forming a second photoresist pattern on the second upper layer using a second developing process; and
   etching the second upper layer, the second middle layer, and the second lower layer by using the photoresist pattern as a mask,
   wherein the second upper layer covers the end of the second middle layer.

3. A method of manufacturing a thin film transistor array panel, comprising:
   forming a first lower layer on a substrate;
   forming a first middle layer on the first lower layer;
   forming a first upper layer on the first middle layer;
   forming a photoresist pattern on the first upper layer using a first developing process;
   forming a first signal line by etching the first upper layer, the first middle layer, and the first lower layer by using the photoresist pattern as a mask;
   forming a thin film transistor connected to the first signal line;
   forming a second signal line connected to the thin film transistor; and
   forming a first electrode connected to the second signal line,
   wherein:
   the first upper layer covers an end of the first middle layer;
   the forming of the second signal line further comprises:
      forming a second lower layer on the substrate;
      forming a second middle layer on the second lower layer;
      forming a second upper layer on the second middle layer;
      forming a second photoresist pattern on the second upper layer using a second developing process; and
      etching the second upper layer, the second middle layer, and the second lower layer by using the photoresist pattern as a mask;
   the second upper layer covers the end of the second middle layer;
   the second lower layer, the second middle layer, and the second upper layer are formed in a sputtering device comprising a mask aligned with edges of the substrate;
   the mask is aligned to overlap the substrate by a third width when forming the second middle layer;
   the mask is aligned to overlap the substrate by a fourth width when forming the second upper layer; and
   the third width is less than the fourth width.

4. The method of claim 3, wherein:
   the first middle layer and the second middle layer comprise Al or AlNiLa; and
   the first lower layer, the second lower layer, the first upper layer, and the second upper layer comprise Mo.

* * * * *